United States Patent
Honjo et al.

(10) Patent No.: US 11,856,740 B2
(45) Date of Patent: Dec. 26, 2023

(54) HEAT RADIATING COOLER WITH RECESSED TRAPS FOR COOLANT

(71) Applicant: Honda Motor Co., Ltd., Tokyo (JP)

(72) Inventors: Takuya Honjo, Tokyo (JP); Masami Ogura, Tokyo (JP); Chisato Motoyama, Tokyo (JP)

(73) Assignee: Honda Motor Co., Ltd., Tokyo (JP)

( * ) Notice: Subject to any disclaimer, the term of this patent is extended or adjusted under 35 U.S.C. 154(b) by 150 days.

(21) Appl. No.: 17/503,369

(22) Filed: Oct. 18, 2021

(65) Prior Publication Data

US 2022/0192059 A1    Jun. 16, 2022

(30) Foreign Application Priority Data

Dec. 14, 2020 (JP) ................................ 2020-206810

(51) Int. Cl.
| | |
|---|---|
| *H05K 7/20* | (2006.01) |
| *H02P 27/08* | (2006.01) |
| *H02M 7/5387* | (2007.01) |
| *H02M 3/158* | (2006.01) |

(52) U.S. Cl.
CPC ..... *H05K 7/20927* (2013.01); *H05K 7/20918* (2013.01); *H02M 3/158* (2013.01); *H02M 7/53871* (2013.01); *H02P 27/08* (2013.01)

(58) Field of Classification Search
CPC ........... H05K 7/20927; H05K 7/20254; H05K 7/2039; H05K 7/20218
See application file for complete search history.

(56) References Cited

U.S. PATENT DOCUMENTS

| | | | |
|---|---|---|---|
| 10,369,497 B2 | 8/2019 | Nakai et al. | |
| 10,874,030 B2 | 12/2020 | Chen et al. | |
| 2016/0338223 A1* | 11/2016 | Tsai | ........................ F28F 3/12 |
| 2020/0214172 A1* | 7/2020 | Chen | ................. H05K 7/20272 |

FOREIGN PATENT DOCUMENTS

| | | |
|---|---|---|
| JP | H11346480 | 12/1999 |
| JP | 2008289330 | 11/2008 |
| JP | 2012104604 | 5/2012 |
| JP | 2014063870 | 4/2014 |
| JP | 2016225339 | 12/2016 |
| JP | 2017162853 | 9/2017 |
| JP | 2020107885 | 7/2020 |
| WO | 2016170809 | 10/2016 |

OTHER PUBLICATIONS

"Office Action of Japan Counterpart Application", dated Sep. 26, 2023, with English translation thereof, p. 1-p. 6.

* cited by examiner

*Primary Examiner* — Lionel Nouketcha
(74) *Attorney, Agent, or Firm* — JCIPRNET (57) ABSTRACT

A cooler includes a heat radiating member and a cover member that form a coolant flow path. The heat radiating member has a first surface on which an object to be cooled is disposed. The heat radiating member includes multiple fin members protruding into the coolant flow path from a second surface of the heat radiating member. The second surface of the heat radiating member is a part of a surface of the coolant flow path. The cover member includes a trap part in which multiple recesses are formed in a portion of an inner surface of the cover member being another part of the surface of the coolant flow path outside a protruding direction of the fin members.

5 Claims, 9 Drawing Sheets

HEAT RADIATING COOLER WITH RECESSED TRAPS FOR COOLANT

CROSS-REFERENCE TO RELATED APPLICATIONS

This application claims the priority benefit of Japan Application No. 2020-206810, filed on Dec. 14, 2020. The entirety of the above-mentioned patent application is hereby incorporated by reference herein and made a part of this specification.

BACKGROUND

Technical Field

The disclosure relates to a cooler.

Related Art

Conventionally, for example, there has been known a semiconductor device including, in a part of a cooling structure forming a coolant flow path through which a coolant circulates, an element mounting part in which multiple elements are mounted on a surface (outer surface), and multiple cooling fins protruding into the coolant flow path from an inner surface facing the element mounting part (see, for example, Patent Document 1, Patent Document 2, Patent Document 3 and Patent Document 4).

PATENT DOCUMENTS

[Patent Document 1] Japanese Patent Laid-open No. 2016-225339
[Patent Document 2] Japanese Patent Laid-open No. 2014-063870
[Patent Document 3] Japanese Patent Laid-open No. H11-346480
[Patent Document 4] Japanese Patent Laid-open No. 2012-104604

By the way, as in the above-mentioned conventional semiconductor device, in the case where multiple cooling fins are provided in the coolant flow path, heat transfer (cooling) efficiency can be improved by finely forming an overall configuration such as arrangement of the cooling fins. However, in the case where fine particles or foreign matter having high thermal conductivity is present in the coolant, due to the cooling fins of a fine configuration, clogging due to the fine particles or foreign matter is likely to occur in the coolant flow path, and there is a risk that cooling performance may deteriorate.

SUMMARY

A cooler according to an aspect of the disclosure includes: a heat radiating member, having a first surface on which an object to be cooled is disposed; a flow path forming member, forming, in combination with the heat radiating member, a coolant flow path through which a coolant circulates; multiple fin members, protruding into the coolant flow path from a second surface of the heat radiating member, the second surface of the heat radiating member being a part of a surface of the coolant flow path; and a trap part, in which at least one recess is formed in a portion of an inner surface of the flow path forming member being another part of the surface of the coolant flow path outside a protruding direction of the fin members.

DESCRIPTION OF THE EMBODIMENTS

The disclosure provides a cooler capable of suppressing deterioration in cooling performance.
The disclosure adopts the following aspects.
(1) A cooler (for example, cooler 10 in an embodiment) according to an aspect of the disclosure includes: a heat radiating member (for example, third heat radiating member 55*b* in an embodiment), having a first surface (for example, mounting surface 55A in an embodiment) on which an object (for example, first module 31 in an embodiment) to be cooled is disposed; a flow path forming member (for example, third cover member 55*e* in an embodiment), forming, in combination with the heat radiating member, a coolant flow path (for example, third coolant flow path 44 in an embodiment) through which a coolant (for example, coolant F in an embodiment) circulates; multiple fin members (for example, third fin members 55*a* in an embodiment), protruding into the coolant flow path from a second surface (for example, inner surface 55B in an embodiment) of the heat radiating member, the second surface of the heat radiating member being a part of a surface of the coolant flow path; and a trap part (for example, trap part 55*d* in an embodiment), in which at least one recess (for example, recess 55*c* in an embodiment) is formed in a portion of an inner surface (for example, inner surface 55C in an embodiment) of the flow path forming member being another part of the surface of the coolant flow path outside a protruding direction (for example, below vehicle 1 in up-down direction in an embodiment) of the fin members.
(2) In the cooler described in the above (1), the recess may be recessed from the inner surface of the flow path forming member in a first direction (for example, first direction and downward direction in up-down direction of vehicle 1 in an } embodiment) orthogonal to a circulation direction of the coolant in the coolant flow path, and may extend along a second direction (for example, second direction and left-right direction of vehicle 1 in an embodiment) orthogonal to the circulation direction.

(3) In the cooler described in the above (1) or (2), the trap part may face the fin members in the protruding direction.

(4) In the cooler described in any one of the above (1) to (3), a direction in which the recess is recessed from the inner surface of the flow path forming member may be downward in a vertical direction.

According to the above (1), by providing the trap part outside the protruding direction of the fin members, in the coolant that circulates between the fin members, foreign matter or the like contained in a part of the coolant that flows into the trap part can be retained in the recess of the trap part. Accordingly, clogging between the fin members due to the foreign matter or the like contained in the coolant can be suppressed, and deterioration in cooling performance can be suppressed.

In the case of the above (2), due to that the recess is formed recessed from the inner surface of the flow path forming member in the first direction orthogonal to the circulation direction of the coolant, the foreign matter or the like that flows into the recess together with a part of the coolant can be easily retained in the recess. Accordingly, clogging between the fin members due to the foreign matter or the like contained in the coolant and deterioration in cooling performance can further be suppressed.

In the case of the above (3), by providing the trap part that faces the fin members in the protruding direction, the coolant that circulates between the fin members can be easily guided to the trap part.

In the case of the above (4), by providing multiple recesses recessed downward in the vertical direction, the foreign matter or the like contained in the coolant can be deposited in the recesses due to the action of gravity. In addition, air or the like other than the coolant can be prevented from remaining in the recesses.

A cooler 10 according to an embodiment of the disclosure is described below with reference to the accompanying drawings.

Figure 1:
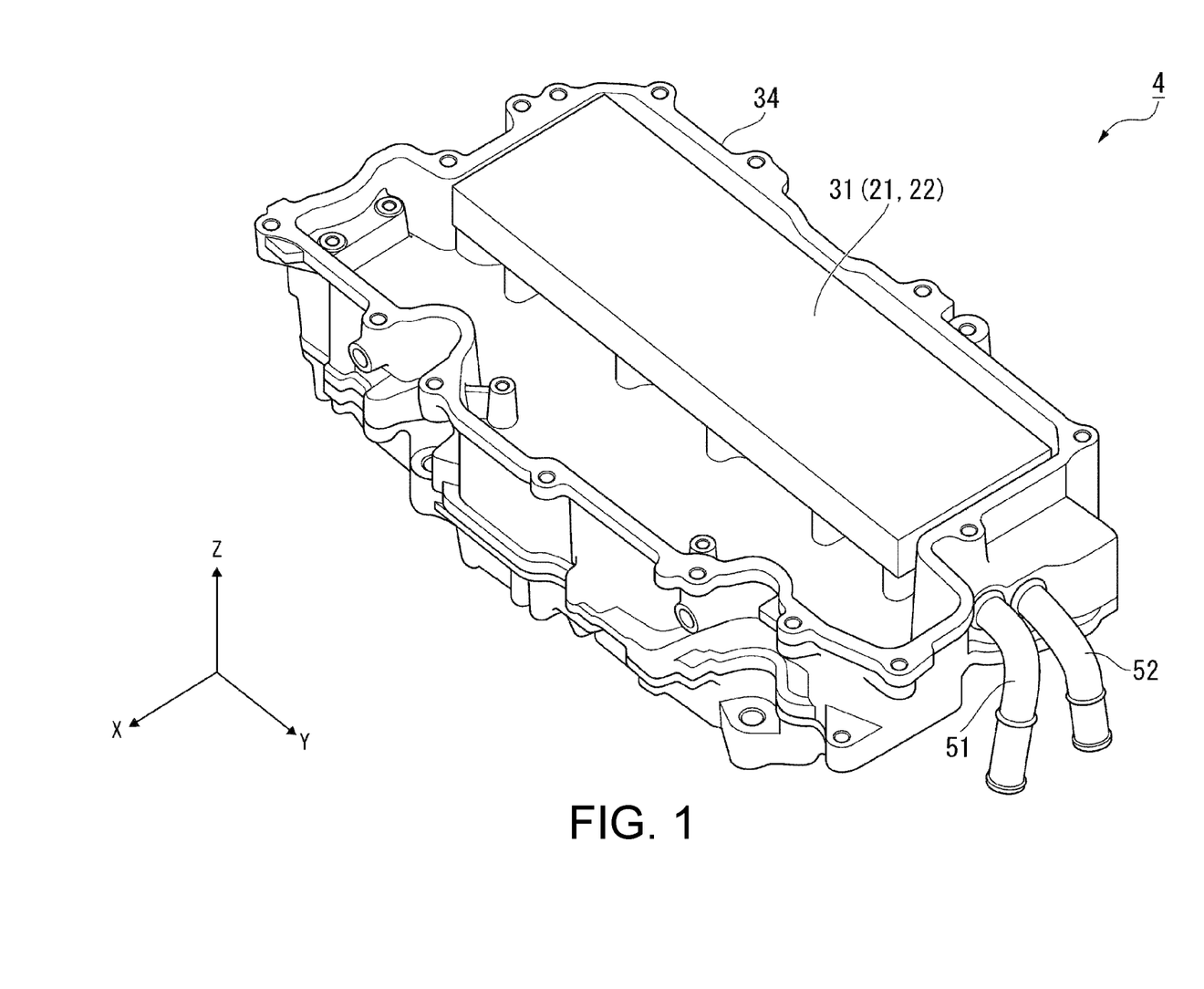
FIG. 1 is a perspective view showing a configuration of a power control unit including a cooler according to an embodiment of the disclosure as viewed from a positive side in a Z-axis direction.
Figure 2:
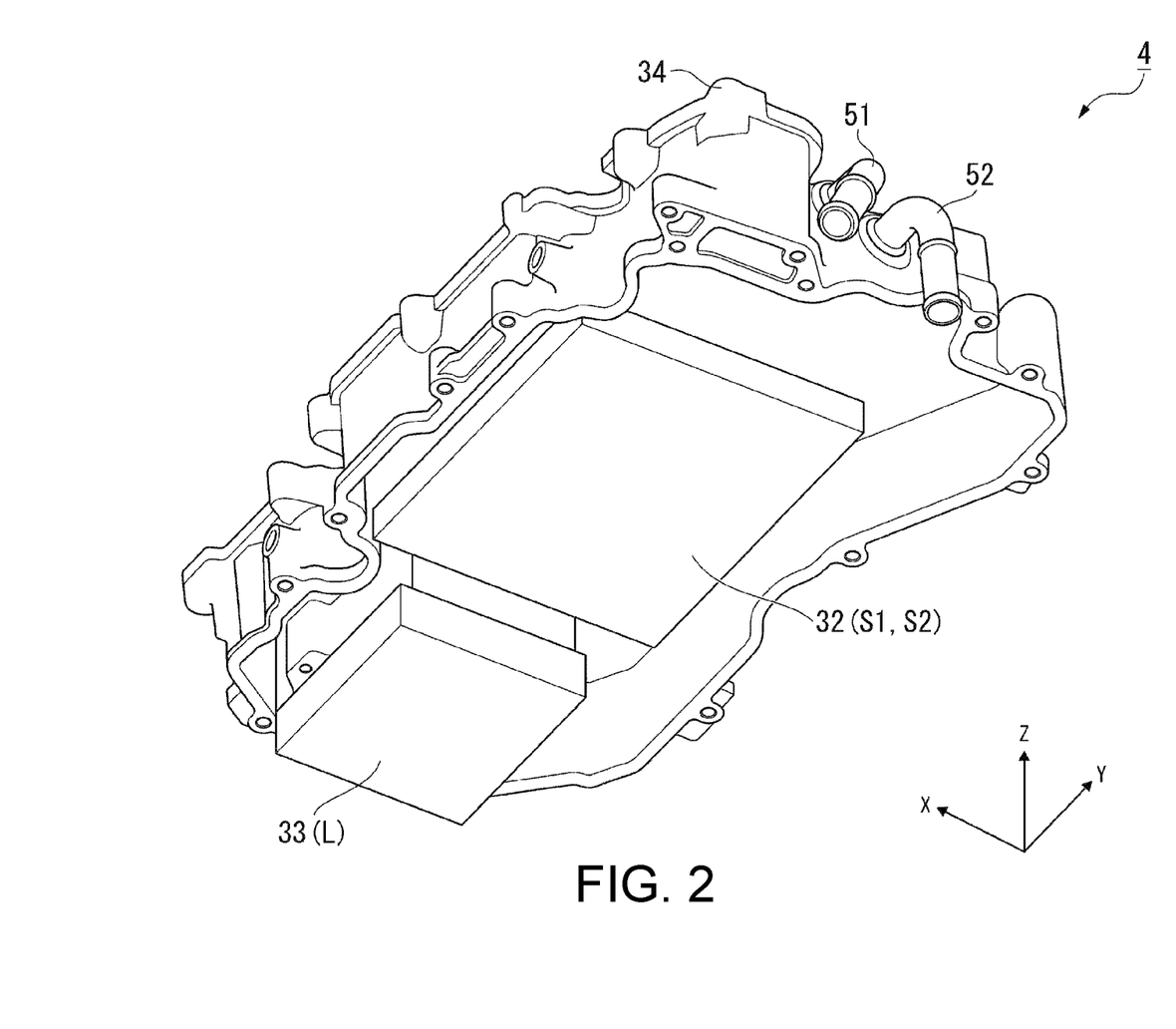
FIG. 2 is a perspective view showing a configuration of a power control unit including a cooler according to an embodiment of the disclosure as viewed from a negative side in the Z-axis direction.
Figure 3:
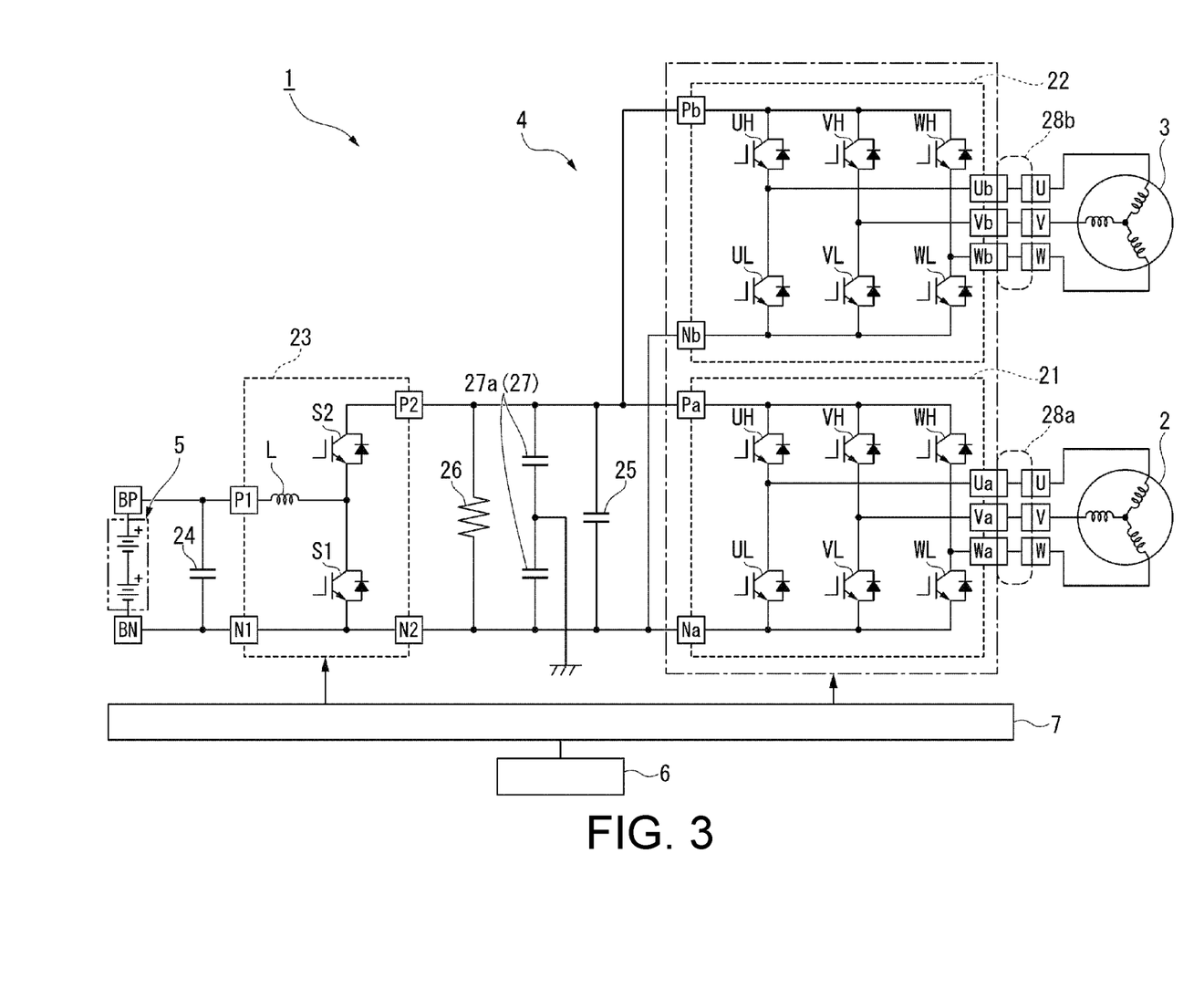
FIG. 3 is a configuration diagram of a vehicle mounted with a power control unit including a cooler according to an embodiment of the disclosure.
Figure 4:
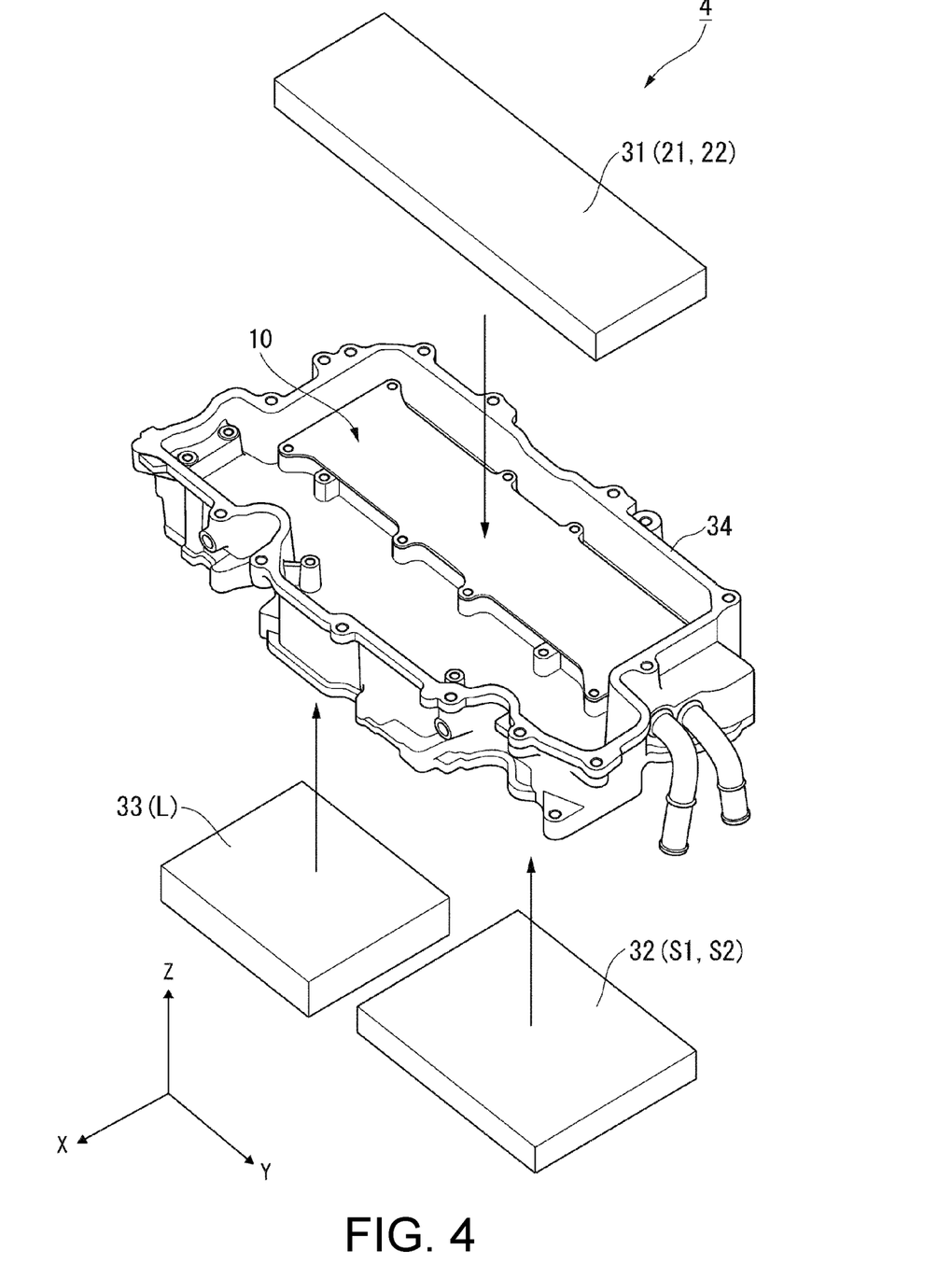
FIG. 4 is an exploded perspective view showing a configuration of a power control unit including a cooler according to an embodiment of the disclosure as viewed from the positive side in the Z-axis direction.

FIG. 1 is a perspective view showing a configuration of a power control unit 4 including the cooler 10 according to an embodiment as viewed from a positive side in a Z-axis direction. FIG. 2 is a perspective view showing a configuration of the power control unit 4 including the cooler 10 according to an embodiment as viewed from a negative side in the Z-axis direction. FIG. 3 is a configuration diagram of a vehicle 1 mounted with the power control unit 4 including the cooler 10 according to an embodiment. FIG. 4 is an exploded perspective view showing a configuration of the power control unit 4 including the cooler 10 according to an embodiment as viewed from the positive side in the Z-axis direction.

In the following, each axial direction of an X-axis, a Y-axis, and a Z-axis orthogonal to each other in a three-dimensional space is a direction parallel to each axis. As shown in, for example, FIG. 1, FIG. 2 and FIG. 4, the Z-axis direction is parallel to a thickness direction of the cooler 10 and an up-down direction of the vehicle 1, and the positive direction in the Z-axis direction is parallel to the upward direction in the up-down direction of the vehicle 1. An X-axis direction and a Y-axis direction is parallel to a left-right direction and a front-rear direction of the vehicle 1.

<Vehicle>

The power control unit 4 including the cooler 10 according to the present embodiment is mounted on the vehicle 1 such as an electric vehicle. The electric vehicle includes an electric car, a hybrid vehicle, a fuel cell vehicle, or the like. The electric car is powered by a battery. The hybrid vehicle is powered by a battery and an internal combustion engine. The fuel cell vehicle is powered by a fuel cell.

As shown in FIG. 3, the vehicle 1 includes, for example, a first rotating electrical machine 2, a second rotating electrical machine 3, a power control unit 4, a battery 5, an electronic control unit 6, and a gate drive unit 7.

The first rotating electrical machine 2 is, for example, for driving the vehicle 1 to travel, and generates a rotational driving force by performing power running by power supplied from the battery 5 via the power control unit 4. The first rotating electrical machine 2 may also generate electric power by performing a regenerative operation by rotational power input to a rotary shaft from a wheel side.

The second rotating electrical machine 3 is, for example, for power generation of the vehicle 1, and generates electric power by the rotational power input to a rotary shaft. The second rotating electrical machine 3, for example, generates electricity by power of an internal combustion engine in the case where the second rotating electrical machine 3 can be connected to the internal combustion engine. The second rotating electrical machine 3, for example, generates electric power by performing a regenerative operation by the rotational power input to the rotary shaft from the wheel side in the case where the second rotating electrical machine 3 can be connected to the wheel. In the case where the second rotating electrical machine 3 can be connected to the wheel, the second rotating electrical machine 3 may also generate a rotational driving force by performing power running by the power supplied from the battery 5 via the power control unit 4.

For example, each of the first rotating electrical machine 2 and the second rotating electrical machine 3 is a three-phase alternating-current brushless DC motor. The three phases are U phase, V phase, and W phase. The first rotating electrical machine 2 and the second rotating electrical machine 3 each include a rotor having a permanent magnet serving as a field magnet and a stator having three phase stator windings for generating a rotating magnetic field for rotating the rotor. The three phase stator windings are connected to the power control unit 4.

The power control unit 4 includes, for example, a first power converter 21 and a second power converter 22, a third power converter 23, a first smoothing condenser (first smoothing capacitor) 24 and a second smoothing condenser (second smoothing capacitor) 25, a resistor 26, and a noise filter 27.

The first power converter 21 and the second power converter 22 include, for example, the same circuit such as an inverter that performs power conversion between direct current and alternating current. Each of the first power converter 21 and the second power converter 22 includes a positive electrode terminal and a negative electrode terminal, as well as three phase terminals, namely, a U-phase terminal, a V-phase terminal, and a W-phase terminal.

A positive electrode terminal Pa of the first power converter 21 and a positive electrode terminal Pb of the second power converter 22 are connected to a second positive electrode terminal P2 of the third power converter 23. A negative electrode terminal Na of the first power converter 21 and a negative electrode terminal Nb of the second power converter 22 are connected to a second negative electrode terminal N2 of the third power converter 23.

Phase terminals Ua, Va, and Wa of the three phases of the first power converter 21 are respectively connected to terminals U, V, and W of the three phase stator windings of the first rotating electrical machine 2 via a three-phase connector 28a. Phase terminals Ub, Vb, and Wb of the three phases of the second power converter 22 are respectively connected to terminals U, V, and W of the three phase stator windings of the second rotating electrical machine 3 via a three-phase connector 28b.

Each of the first power converter 21 and the second power converter 22 includes, for example, a bridge circuit formed of multiple switching elements and rectifying elements that are three-phase bridge connected. The switching element is a transistor such as an insulated-gate bipolar transistor (IGBT) or a metal-oxide-semiconductor field-effect transistor (MOSFET). The rectifying element is a diode connected in parallel to each transistor.

The bridge circuit includes a high side arm U-phase transistor UH paired with a low side arm U-phase transistor UL, a high side arm V-phase transistor VH paired with a low side arm V-phase transistor VL, and a high side arm W-phase transistor WH paired with a low side arm W-phase transistor WL. The bridge circuit includes, between a collector and an emitter of each of the transistors UH, UL, VH, VL, WH, and WL, a freewheeling diode connected in a forward direction from the emitter to the collector.

The collector of each of the transistors UH, VH, and WH of the high side arm is connected to a positive electrode terminal (positive electrode terminal Pa or positive electrode terminal Pb). The emitter of each of the transistors UL, VL, and WL of the low side arm is connected to a negative electrode terminal (negative electrode terminal Na or negative electrode terminal Nb). In each of the three phases, the emitter of each of the transistors UH, VH, and WH of the high side arm and the collector of each of the transistors UL, VL, and WL of the low side arm are connected to each phase terminal (each of the phase terminals Ua, Va, and Wa or each of the phase terminals Ub, Vb, and Wb) of the three phases.

Each of the first power converter 21 and the second power converter 22 controls operation of each of the first rotating electrical machine 2 and the second rotating electrical machine 3. The first power converter 21 and the second power converter 22 each switch a transistor pair of each phase ON (conducting) or OFF (cutoff) based on a gate signal being a switching command input to a gate of each of the transistors UH, VH, WH, UL, VL, and WL.

The first power converter 21 and the second power converter 22 each convert DC power input from each of the positive electrode terminals Pa and Pb and each of the negative electrode terminals Na and Nb into three-phase AC power and supplies it to each of the first rotating electrical machine 2 and the second rotating electrical machine 3 during, for example, power running of each of the first rotating electrical machine 2 and the second rotating electrical machine 3. The first power converter 21 and the second power converter 22 each generate a rotational driving force by sequentially commuting a current to the three phase stator windings of each of the first rotating electrical machine 2 and the second rotating electrical machine 3.

For example, during regeneration of each of the first rotating electrical machine 2 and the second rotating electrical machine 3, the first power converter 21 and the second power converter 22 each convert three-phase AC power input from each of the phase terminals Ua, Va, Wa, Ub, Vb, and Wb of the three phases into DC power by performing ON (conducting)/OFF (cutoff) driving on the transistor pair of each phase synchronized with rotation of each of the first rotating electrical machine 2 and the second rotating electrical machine 3. It is possible that each of the first power converter 21 and the second power converter 22 supplies the DC power converted from the three-phase AC power to the battery 5 via the third power converter 23.

The third power converter 23 includes, for example, a DC-DC converter performing bidirectional step-up and step-down power conversion. The third power converter 23 includes a first positive electrode terminal P1 and a first negative electrode terminal N1, and the second positive electrode terminal P2 and the second negative electrode terminal N2.

The first positive electrode terminal P1 and the first negative electrode terminal N1 of the third power converter 23 are connected to a positive electrode terminal BP and a negative electrode terminal BN of the battery 5. The second positive electrode terminal P2 and the second negative electrode terminal N2 of the third power converter 23 are respectively connected to the positive electrode terminals Pa and Pb and the negative electrode terminals Na and Nb of the first power converter 21 and the second power converter 22.

The third power converter 23 includes, for example, a pair of switching elements of a low side arm and a high side arm, a rectifying element, and a reactor. The switching element is a transistor such as an IGBT or MOSFET. The pair of switching elements of the low side arm and the high side arm includes a first transistor S1 of the low side arm and a second transistor S2 of the high side arm. The rectifying element is a freewheeling diode connected in parallel in the forward direction from an emitter to a collector between the collector and the emitter of each of the first transistor S1 and the second transistor S2. The reactor is a choke coil L.

The emitter of the first transistor S1 of the low side arm is connected to the first negative electrode terminal N1 and the second negative electrode terminal N2. The collector of the second transistor S2 of the high side arm is connected to the second positive electrode terminal P2. The collector of the first transistor S1 and the emitter of the second transistor S2 are connected to a first end of both ends of the choke coil L. A second end of the both ends of the choke coil L is connected to the first positive electrode terminal P1.

The third power converter 23 switches each of the first transistor S1 and the second transistor S2 ON (conducting) or OFF (cutoff) based on a gate signal being a switching command input to a gate of each of the first transistor S1 and the second transistor S2.

During step-up, the third power converter 23 steps up the power input from the battery 5 to the first positive electrode terminal P1 and the first negative electrode terminal N1, and outputs the power after step-up from the second positive electrode terminal P2 and the second negative electrode terminal N2. The third power converter 23 accumulates magnetic energy by DC excitation of the reactor (choke coil L) when the second transistor S2 of the high side arm is turned OFF (cut off) and the first transistor S1 of the low side arm is turned ON (conducted). By overlap of an induced voltage generated by the magnetic energy of the reactor (choke coil L) when the second transistor S2 of the high side arm is turned ON (conducted) and the first transistor S1 of the low side arm is turned OFF (cut off) and a voltage applied to the first positive electrode terminal P1 and the first negative electrode terminal N1, the third power converter 23 causes a higher voltage than that of the first positive electrode terminal P1 and the first negative electrode terminal N1 to be generated in the second positive electrode terminal P2 and the second negative electrode terminal N2.

During step-down, the third power converter 23 steps down the power input from the second positive electrode terminal P2 and the second negative electrode terminal N2, and outputs the power after step-down from the first positive electrode terminal P1 and the first negative electrode terminal N1 to the battery 5. The third power converter 23 accumulates magnetic energy by DC excitation of the reactor (choke coil L) when the second transistor S2 of the high side arm is turned ON (conducted) and the first transistor S1 of the low side arm is turned OFF (cut off). By step-down of an induced voltage generated by the magnetic energy of the reactor (choke coil L) when the second transistor S2 of the high side arm is turned OFF (cut off) and the first transistor S1 of the low side arm is turned ON (conducted), the third power converter 23 causes a lower voltage than that of the second positive electrode terminal P2 and the second negative electrode terminal N2 to be generated in the first positive electrode terminal P1 and the first negative electrode terminal N1.

The first smoothing condenser 24 is connected between the first positive electrode terminal P1 and the first negative electrode terminal N1 of the third power converter 23. The first smoothing condenser 24 is connected in parallel to the battery 5. The first smoothing condenser 24 smooths voltage fluctuation that occurs with an ON/OFF switching operation of the first transistor S1 and the second transistor S2 at the time of step-down of the third power converter 23.

The second smoothing condenser 25 is connected between the second positive electrode terminal P2 and the second negative electrode terminal N2 of the third power converter 23. The second smoothing condenser 25 smooths voltage fluctuation that occurs with the ON/OFF switching operation of each of the transistors UH, UL, VH, VL, WH, and WL of the first power converter 21 and the second power converter 22. The second smoothing condenser 25 smooths voltage fluctuation that occurs with the ON/OFF switching operation of the first transistor S1 and the second transistor S2 at the time of step-up of the third power converter 23.

The resistor 26 is connected between the positive electrode terminal Pa and the negative electrode terminal Na of the first power converter 21, between the positive electrode terminal Pb and the negative electrode terminal Nb of the second power converter 22, and between the second positive electrode terminal P2 and the second negative electrode terminal N2 of the third power converter 23.

The noise filter 27 is connected between the positive electrode terminal Pa and the negative electrode terminal Na of the first power converter 21, between the positive electrode terminal Pb and the negative electrode terminal Nb of the second power converter 22, and between the second positive electrode terminal P2 and the second negative electrode terminal N2 of the third power converter 23. The noise filter 27 includes two condensers (capacitors) 27a connected in series. A connection point of the two condensers 27a is connected to a body ground or the like of the vehicle 1.

The battery 5 is, for example, a high-voltage battery being a power source of the vehicle 1. The battery 5 includes a battery case and multiple battery modules housed in the battery case. The battery module includes multiple battery cells connected in series or in parallel.

The battery 5 includes the positive electrode terminal BP connected to the first positive electrode terminal P1 of the third power converter 23 and the negative electrode terminal BN connected to the first negative electrode terminal N1 of the third power converter 23. The positive electrode terminal BP and the negative electrode terminal BN of the battery 5 are connected to a positive electrode end and a negative electrode end of the battery modules connected in series in the battery case.

The electronic control unit 6 controls operation of each of the first rotating electrical machine 2 and the second rotating electrical machine 3. For example, the electronic control unit 6 is a software function part that functions by executing a predetermined program by a processor such as a central processing unit (CPU). The software function part is an electronic control unit (ECU) including a processor such as a CPU, a read-only memory (ROM) storing a program, a random-access memory (RAM) temporarily storing data, and an electronic circuit such as a timer. At least a part of the electronic control unit 6 may be an integrated circuit such as large scale integration (LSI).

For example, the electronic control unit 6 executes current feedback control using a current detection value of the first rotating electrical machine 2 and a current target value corresponding to a torque command value of the first rotating electrical machine 2, and generates a control signal to be input to the gate drive unit 7.

For example, the electronic control unit 6 executes current feedback control using a current detection value of the second rotating electrical machine 3 and a current target value corresponding to a regeneration command value of the second rotating electrical machine 3, and generates the control signal to be input to the gate drive unit 7.

The control signal is a signal indicating a timing for performing ON (conducting)/OFF (cutoff) driving on each of the transistors UH, VH, WH, UL, VL, and WL of the first power converter 21 and the second power converter 22. For example, the control signal is a pulse width modulated signal or the like.

The electronic control unit 6 controls the bidirectional step-up and step-down power conversion of the third power converter 23. For example, the electronic control unit 6 generates the control signal to be input to gate drive unit 7 using a current target value corresponding to a step-up voltage command at the time of step-up of the third power converter 23 or a step-down voltage command at the time of step-down of the third power converter 23. The control signal is a signal indicating a timing for performing ON (conducting)/OFF (cutoff) driving on each of the first transistor S1 and the second transistor S2 of the third power converter 23.

Based on the control signal received from the electronic control unit 6, the gate drive unit 7 generates the gate signal for actually performing ON (conducting)/OFF (cutoff) driving on each of the transistors UH, VH, WH, UL, VL, and WL of the first power converter 21 and the second power converter 22. For example, the gate signal is generated by performing amplification, level shift or the like on the control signal.

The gate drive unit 7 generates the gate signal for performing ON (conducting)/OFF (cutoff) driving on each of the first transistor S1 and the second transistor S2 of the third power converter 23. For example, the gate drive unit 7 generates the gate signal having a duty ratio corresponding to the step-up voltage command at the time of step-up of the third power converter 23 or the step-down voltage command at the time of regeneration of the third power converter 23. The duty ratio is a ratio of ON time of the first transistor S1 to ON time of the second transistor S2.

<Power Control Unit>

As shown in FIG. 1, FIG. 2 and FIG. 4, the power control unit 4 includes the cooler 10, a first module 31, a second module 32, a third module 33, and a case 34.

The first module 31 is an aggregate of multiple power semiconductor elements (transistors and diodes) constituting the first power converter 21 and the second power converter 22 or the like. The power semiconductor elements include, for example, each of the transistors UH, VH, WH, UL, VL, and WL and each freewheeling diode. The second module 32 is an aggregate of multiple power semiconductor elements (transistors and diodes) of the third power converter 23. The power semiconductor elements include the first transistor S1, the second transistor S2, and a freewheeling diode. The third module 33 is an aggregate of various reactors including the choke coil L of the third power converter 23.

The outer shape of the case 34 is, for example, a cylinder. The cooler 10, the first module 31, the second module 32, and the third module 33 are disposed inside the case 34. The first module 31, the second module 32, and the third module 33 are disposed so as to sandwich the cooler 10 from both sides of the vehicle 1 in the up-down direction. The first module 31 is disposed above the cooler 10, and the second module 32 and the third module 33 are disposed below the cooler 10.

<Cooler>

Figure 5:
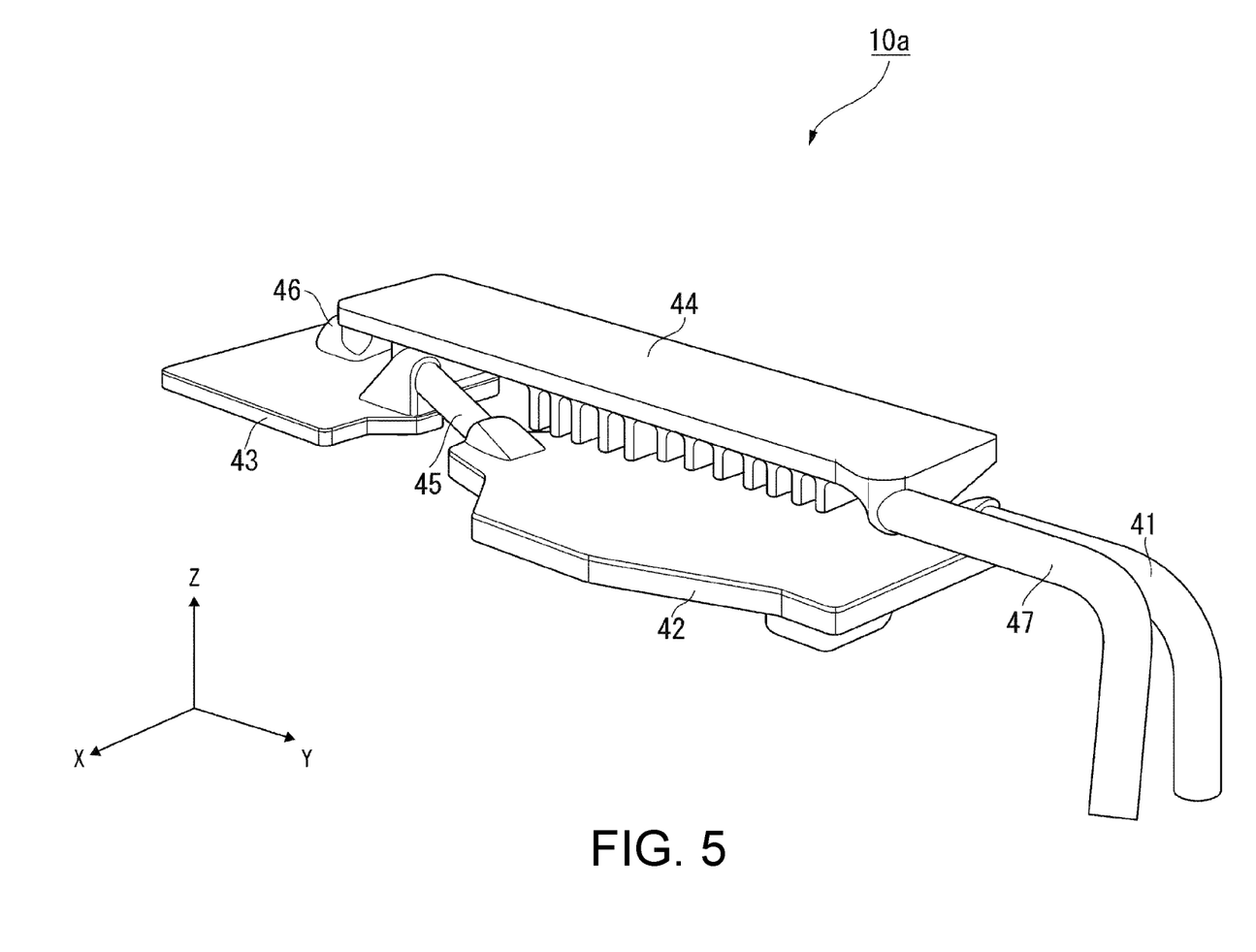
FIG. 5 is a perspective view showing a coolant flow path model of a cooler according to an embodiment of the disclosure.
Figure 6:
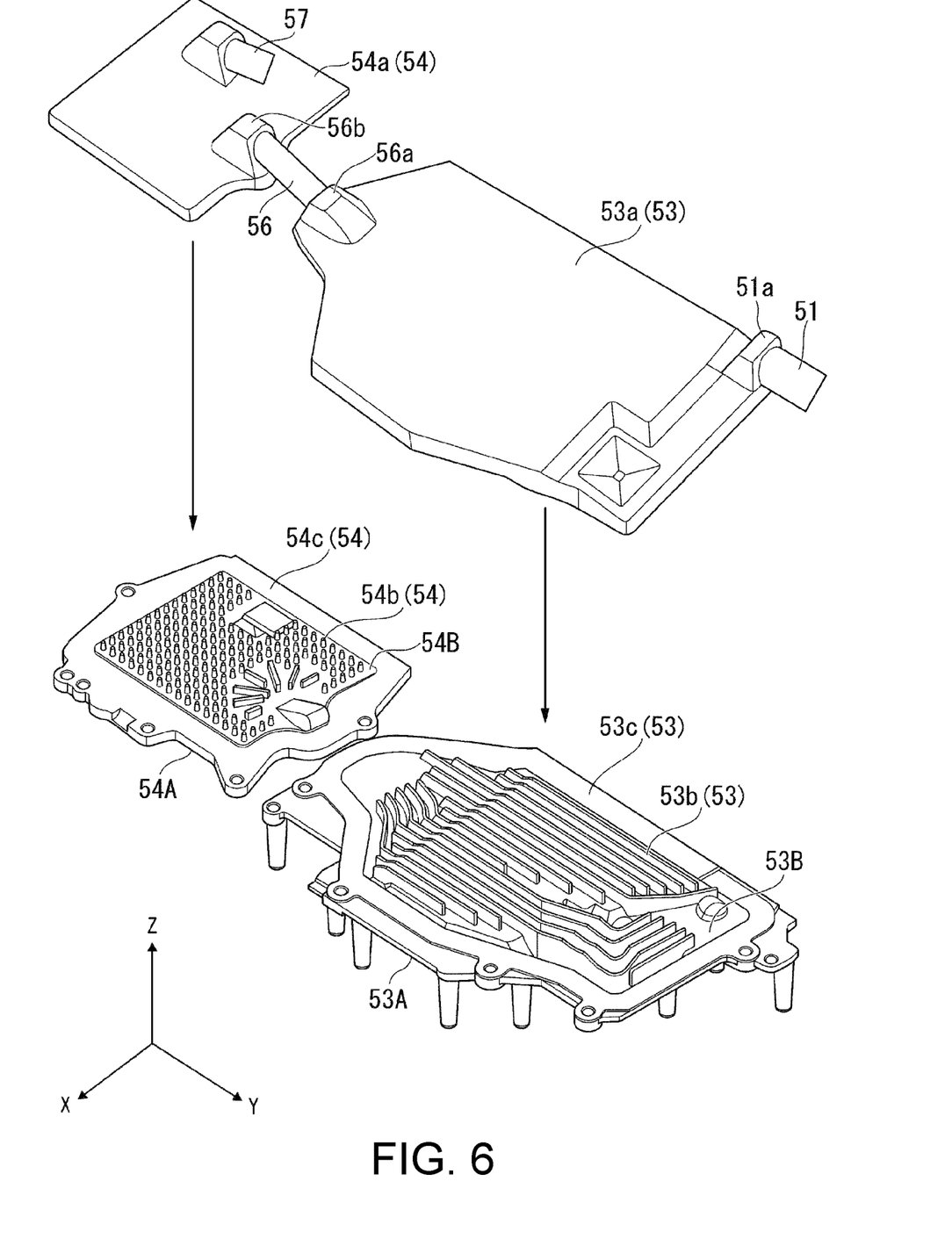
FIG. 6 is an exploded perspective view showing a first flow path forming part and a second flow path forming part that form a first coolant flow path and a second coolant flow path of the coolant flow path model shown in FIG. 5.
Figure 7:
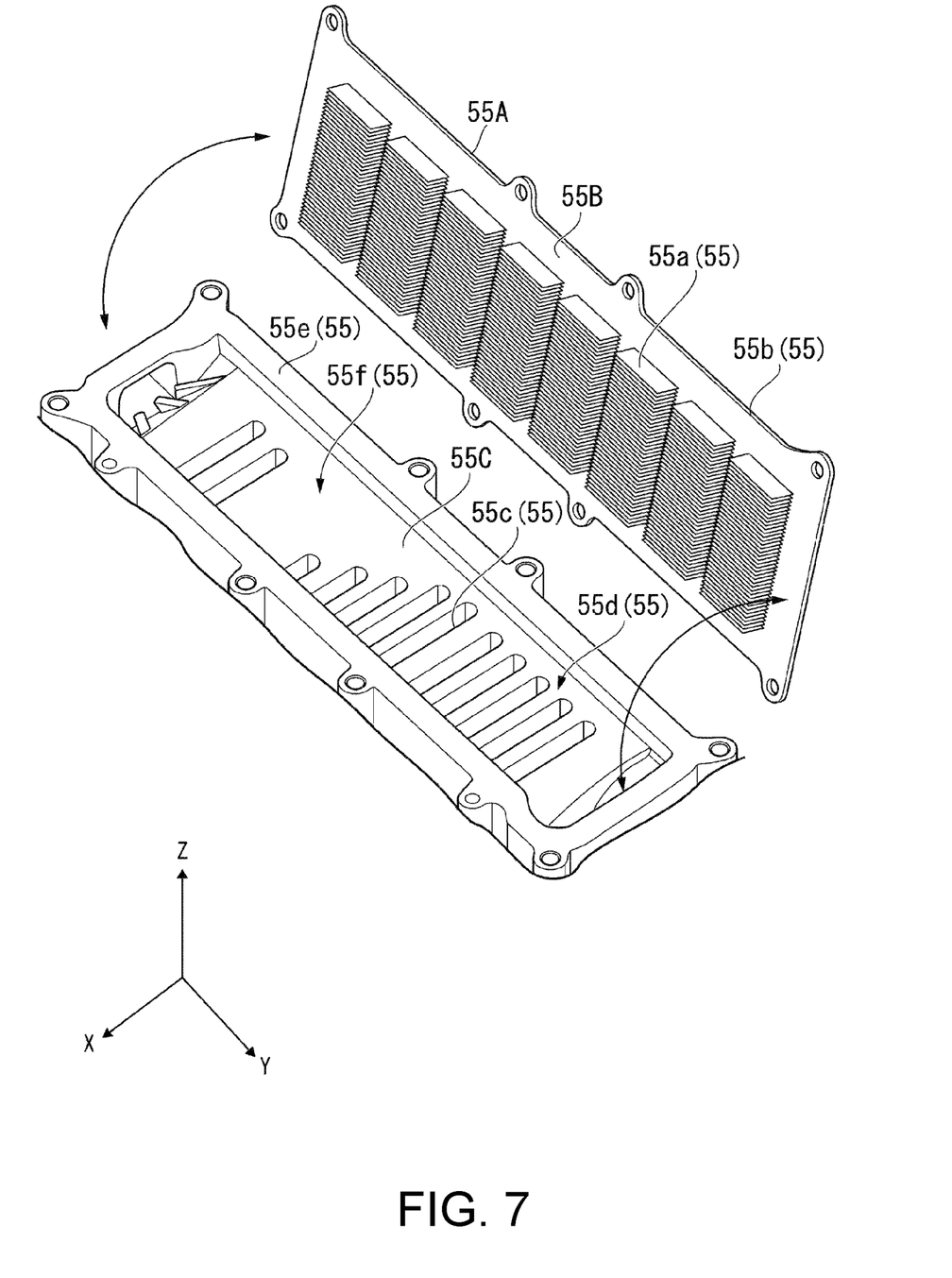
FIG. 7 is an exploded perspective view showing a third flow path forming part that forms a third coolant flow path of the coolant flow path model shown in FIG. 5.

FIG. 5 is a perspective view showing a coolant flow path model 10a of the cooler 10 according to an embodiment. FIG. 6 is an exploded perspective view showing a first flow path forming part 53 and a second flow path forming part 54 that form a first coolant flow path 42 and a second coolant flow path 43 of the coolant flow path model 10a shown in FIG. 5. FIG. 7 is an exploded perspective view showing a third flow path forming part 55 that forms a third coolant flow path 44 of the coolant flow path model 10a shown in FIG. 5.

As shown in FIG. 5, the coolant flow path model 10a of the cooler 10 includes a coolant supply flow path 41, a first coolant flow path 42, a second coolant flow path 43, a third coolant flow path 44, a first connection flow path 45, a second connection flow path 46, and a coolant discharge flow path 47.

The coolant supply flow path 41 is connected to the first coolant flow path 42. The first coolant flow path 42 is connected to the second coolant flow path 43 by the first connection flow path 45. A coolant circulating through the first coolant flow path 42 cools the second module 32. The second coolant flow path 43 is connected to the third coolant flow path 44 by the second connection flow path 46. The coolant circulating through the second coolant flow path 43 cools the third module 33. The third coolant flow path 44 is connected to the coolant discharge flow path 47. The coolant circulating through the third coolant flow path 44 cools the first module 31.

As shown in FIG. 1 and FIG. 2, the cooler 10 includes a supply pipe 51 that forms the coolant supply flow path 41 and a discharge pipe 52 that forms the coolant discharge flow path 47.

As shown in FIG. 6 and FIG. 7, the cooler 10 includes the first flow path forming part 53 that forms the first coolant flow path 42, the second flow path forming part 54 that forms the second coolant flow path 43, the third flow path forming part 55 that forms the third coolant flow path 44, a first connection pipe 56 that forms the first connection flow path 45, and a second connection pipe 57 that forms the second connection flow path 46.

As shown in FIG. 6, the first flow path forming part 53 includes a first cover member 53a, and a first heat radiating member 53c in which multiple first fin members 53b are formed. The first cover member 53a is disposed on the upper side in the up-down direction of the vehicle 1, and the first heat radiating member 53c is disposed on the lower side. The supply pipe 51 and the first connection pipe 56 are connected to the first cover member 53a. The outer shape of the first heat radiating member 53c is, for example, a plate shape having a mounting surface 53A on which the second module 32 being the object to be cooled is disposed.

The outer shape of each of the first fin members 53b is, for example, a plate shape. The first fin members 53b protrude into the first coolant flow path 42 from an inner surface 53B of the first heat radiating member 53c that constitutes a part of a surface of the first coolant flow path 42, and extend from around a connection part 51a of the supply pipe 51 toward around a connection part 56a of the first connection pipe 56.

The second flow path forming part 54 includes a second cover member 54a, and a second heat radiating member 54c in which multiple second fin members 54b are formed. The second cover member 54a is disposed on the upper side in the up-down direction of the vehicle 1, and the second heat radiating member 54c is disposed on the lower side. The first connection pipe 56 and the second connection pipe 57 are connected to the second cover member 54a. The outer shape of the second heat radiating member 54c is, for example, a plate shape having a mounting surface 54A on which the third module 33 being the object to be cooled is disposed.

The outer shape of each of the second fin members 54b is, for example, a plate shape or a pin shape. The second fin members 54b protrude into the second coolant flow path 43 from an inner surface 54B of the second heat radiating member 54c that constitutes a part of a surface of the second coolant flow path 43. The second fin members 54b include multiple plate-shaped fin members extending radially around a connection part 56b of the first connection pipe 56, and multiple pin-shaped fin members dispersedly disposed on the inner surface 54B.

As shown in FIG. 7, the third flow path forming part 55 includes a third heat radiating member 55b in which multiple third fin members 55a are formed, and a third cover member 55e having a trap part 55d in which multiple recesses 55c are formed. The third heat radiating member 55b is disposed on the upper side in the up-down direction of the vehicle 1, and the third cover member 55e is disposed on the lower side. The outer shape of the third heat radiating member 55b is, for example, a plate shape having a mounting surface 55A on which the first module 31 being the object to be cooled is disposed. The second connection pipe 57 and the discharge pipe 52 are connected to the third cover member 55e.

The outer shape of each of the third fin members 55a is, for example, a plate shape extending in a circulation direction of the coolant. The third fin members 55a protrude into the third coolant flow path 44 from an inner surface 55B of the third heat radiating member 55b that constitutes a part of a surface of the third coolant flow path 44. The third fin members 55a, for example, are provided in multiple rows at predetermined first intervals along the circulation direction of the coolant from a connection part of the second connection pipe 57 toward a connection part of the discharge pipe 52; for each of the multiple rows, the third fin members 55a are arranged at predetermined second intervals along a direction orthogonal to the circulation direction of the coolant. The multiple rows are, for example, eight rows. The circulation direction of the coolant is, for example, parallel to the front-rear direction of the vehicle 1, and the direction orthogonal to the circulation direction of the coolant is, for example, parallel to the left-right direction of the vehicle 1.

The recesses 55c are formed in a portion of an inner surface 55C of the third cover member 55e that constitutes another part of the surface of the third coolant flow path 44 outside a protruding direction of the third fin members 55a. The portion outside the protruding direction of the third fin members 55a is, for example, a portion below the third fin members 55a in the up-down direction of the vehicle 1. The recesses 55c are recessed from the inner surface 55C of the third cover member 55e in a first direction orthogonal to the circulation direction of the coolant, and extend along a second direction orthogonal to the circulation direction of the coolant. The first direction is, for example, parallel to the downward direction in the up-down direction of the vehicle 1, and the second direction is, for example, parallel to the left-right direction of the vehicle 1.

The trap part 55d in which the recesses 55c are formed in a part of the inner surface 55C of the third cover member 55e faces the third fin members 55a in the protruding direction. The trap part 55d, for example, is provided in a portion of the inner surface 55C of the third cover member 55e overlapping the first flow path forming part 53 and the second flow path forming part 54 as viewed from the up-down direction of the vehicle 1 (thickness direction of the cooler 10). That is, in the inner surface 55C of the third cover member 55e, no recess 55c is formed in a portion 55f overlapping an area (area where the second connection pipe 57 is disposed) between the first flow path forming part 53 and the second flow path forming part 54 disposed spaced apart by a predetermined along, for example, the front-rear direction of the vehicle 1.

Figure 8:
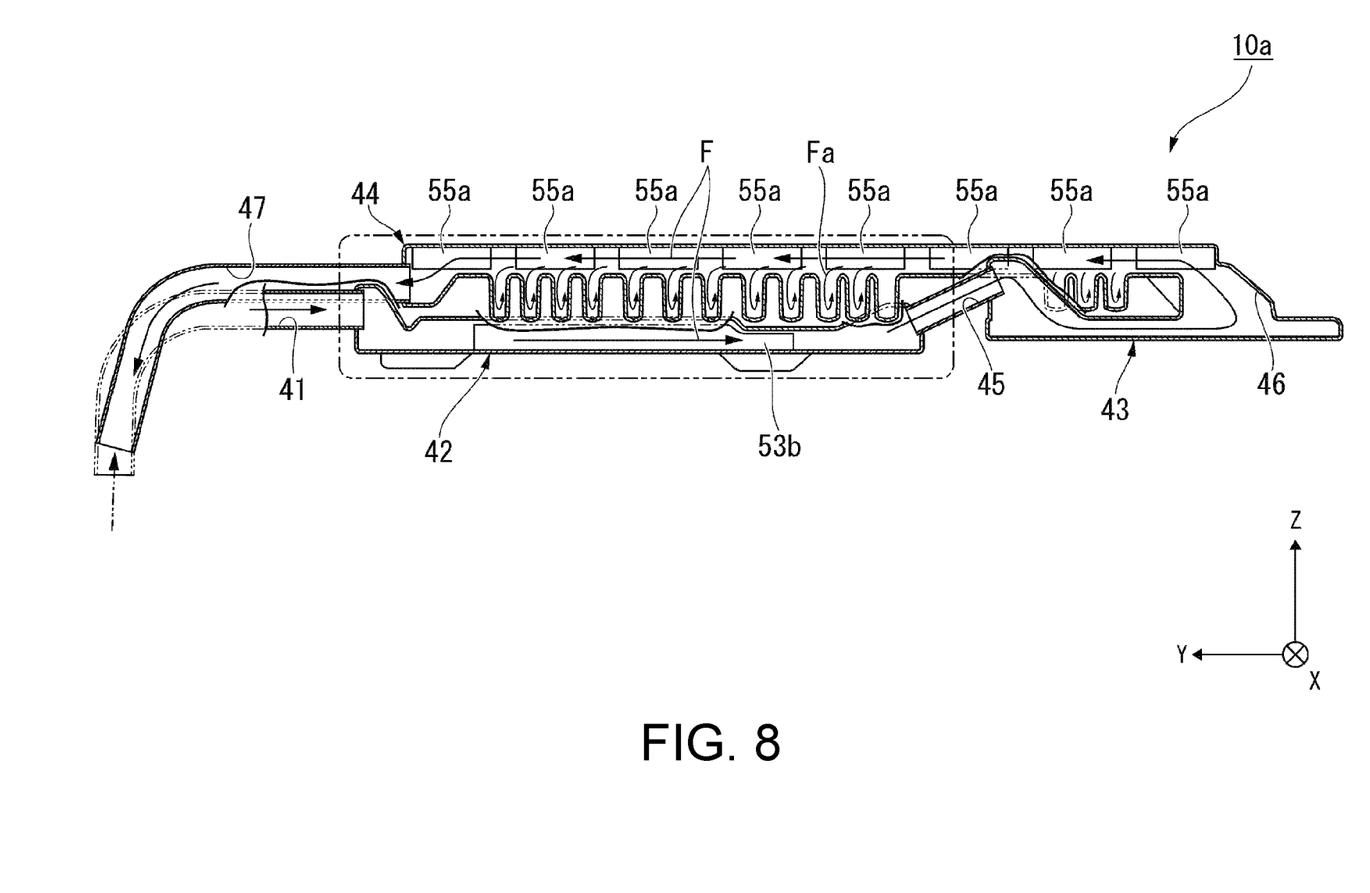
FIG. 8 illustrates a circulation state of a coolant in a coolant flow path model of a cooler according to an embodiment of the disclosure.
Figure 9:
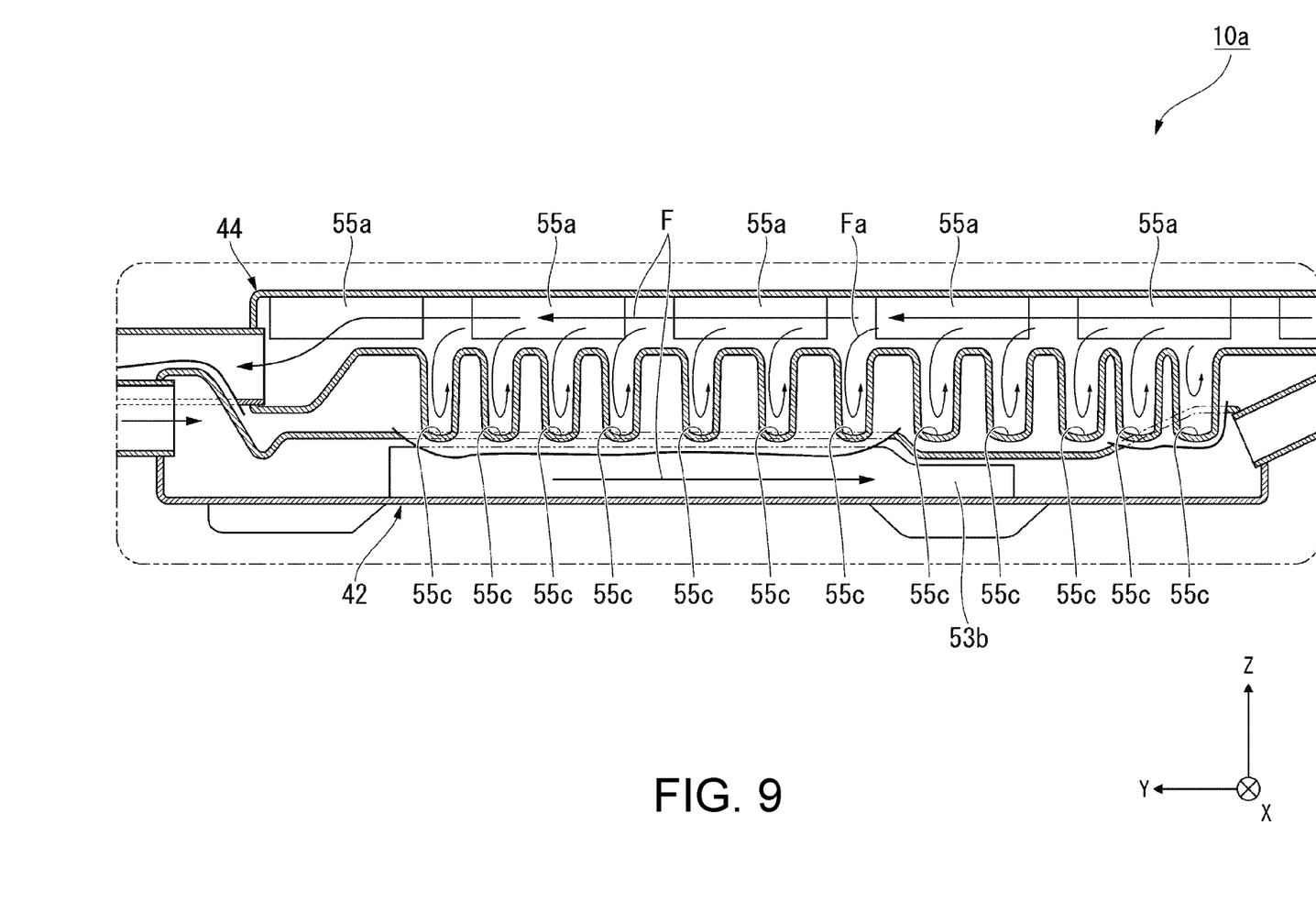
FIG. 9 is an enlarged view showing a part of the coolant flow path model shown in FIG. 8.

FIG. 8 illustrates a circulation state of a coolant in the coolant flow path model 10a of the cooler 10 according to an embodiment. FIG. 9 is an enlarged view showing a part of the coolant flow path model 10a shown in FIG. 8.

As shown in FIG. 8 and FIG. 9, the coolant flowing into the first coolant flow path 42 from the outside of the cooler 10 via the coolant supply flow path 41 flows between the first fin members 53b and cools the second module 32. The coolant flowing from the first coolant flow path 42 into the second coolant flow path 43 via the first connection flow path 45 flows between the second fin members 54b and cools the third module 33. The coolant flowing from the second coolant flow path 43 into the third coolant flow path 44 via the second connection flow path 46 flows between the third fin members 55a and cools the first module 31. The coolant flowing from the third coolant flow path 44 to the coolant discharge flow path 47 flows out to the outside of the cooler 10.

By providing the trap part 55d in which the recesses 55c are formed below (for example, below in the vertical direction) the third fin members 55a, a partial coolant Fa being a part of a coolant F flowing between the third fin members 55a of the third coolant flow path 44 flows into the recesses 55c due to the action of gravity. For example, in the case where foreign matter heavier than the coolant F is contained in the coolant F, the foreign matter flowing into each recess 55c together with the partial coolant Fa is deposited in each recess 55c due to the action of gravity. For example, the foreign matter flowing into each recess 55c together with the partial coolant Fa is deposited in each recess 55c in the case where the gravity that acts on the foreign matter is greater than a force in a flow direction of the partial coolant Fa that acts on the foreign matter.

As described above, in the cooler 10 of an embodiment, by providing the trap part 55d in the third flow path forming part 55 outside the protruding direction of the third fin members 55a, in the coolant F that circulates between the third fin members 55a, the foreign matter or the like contained in the partial coolant Fa that flows into the trap part 55d can be retained in the recess 55c of the trap part 55d. Accordingly, clogging between the third fin members 55a due to the foreign matter or the like contained in the coolant F can be suppressed, and deterioration in cooling performance can be suppressed.

Due to that the recesses 55c are formed recessed from the inner surface 55C of the third cover member 55e in the first direction orthogonal to the circulation direction of the coolant F, the foreign matter or the like that flows into each recess 55c together with the partial coolant Fa can be easily retained in each recess 55c. Accordingly, clogging between the third fin members 55a due to the foreign matter or the like contained in the coolant F and deterioration in cooling performance can further be suppressed.

By providing the trap part 55d that faces the third fin members 55a in the protruding direction, the coolant F that circulates between the third fin members 55a can be easily guided to the trap part 55d.

By providing the recesses 55c recessed downward in the vertical direction, the foreign matter or the like contained in the coolant F and the partial coolant Fa can be deposited in the recesses 55c due to the action of gravity. In addition, air or the like other than the coolant F and the partial coolant Fa can be prevented from remaining in the recesses 55c.

(Modifications)

Modifications of the embodiments are described below. The same parts as those in the above-described embodiments are designated by the same reference numerals, and the description thereof will be omitted or simplified.

In the above-described embodiments, the outer shape of each of the third fin members 55a is a plate shape extending in the circulation direction of the coolant. However, the disclosure is not limited thereto, and the outer shape may be other shape such as a pin shape.

The embodiments of the disclosure are presented as examples but are not intended to limit the scope of the disclosure. These embodiments can be implemented in various other forms, and various omissions, replacements, and changes can be made without departing from the gist of the disclosure. These embodiments or modifications thereof are included in the scope or gist of the disclosure, as well as in the scope of the disclosure described in the claims and the equivalent scope thereof.

What is claimed is:

1. A cooler comprising:
   a heat radiating member, having a first surface on which an object to be cooled is disposed;
   a flow path forming member, forming, in combination with the heat radiating member, a coolant flow path through which a coolant circulates, wherein the flow path foaming member comprises a cover member;
   a plurality of fin members, protruding into the coolant flow path from a second surface of the heat radiating member, the second surface of the heat radiating member being a part of a surface of the coolant flow path; and
   a trap part comprising at least one recess, wherein the at least one recess is formed in a portion of an inner surface of the flow path forming member, the inner surface being another part of the surface of the coolant flow path outside a protruding direction of the plurality of fin members,
   wherein the at least one recess comprises a plurality of undulating recesses disposed in a circulation direction of the coolant in the coolant flow path.

2. The cooler according to claim 1, wherein
the at least one recess is recessed from the inner surface of the flow path forming member in a first direction orthogonal to a circulation direction of the coolant in the coolant flow path, and extends along a second direction orthogonal to the circulation direction.

3. The cooler according to claim 2, wherein
the trap part faces the plurality of fin members in the protruding direction.

4. The cooler according to claim 1, wherein
the trap part faces the plurality of fin members in the protruding direction.

5. The cooler according to claim 1, wherein
a direction in which the at least one recess is recessed from the inner surface of the flow path forming member is downward in a vertical direction.

\* \* \* \* \*